United States Patent
Monadgemi et al.

(10) Patent No.: US 9,212,051 B1
(45) Date of Patent: Dec. 15, 2015

(54) SYSTEMS AND METHODS FOR FORMING MEMS ASSEMBLIES INCORPORATING GETTERS

(75) Inventors: Pezhman Monadgemi, Fremont, CA (US); Lei Wang, Fremont, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 649 days.

(21) Appl. No.: 13/198,448

(22) Filed: Aug. 4, 2011

(51) Int. Cl.
  G01L 9/00 (2006.01)
  H01L 29/84 (2006.01)
  B05D 5/12 (2006.01)
  B81B 7/00 (2006.01)

(52) U.S. Cl.
  CPC .............. B81B 7/007 (2013.01); B81B 7/0006 (2013.01)

(58) Field of Classification Search
  CPC .................. B81B 7/007; B81B 7/0006; H01L 2924/1461
  USPC ........................................... 257/419, E29.324
  See application file for complete search history.

(56) References Cited

U.S. PATENT DOCUMENTS

| | | | |
|---|---|---|---|
| 6,630,725 B1 * | 10/2003 | Kuo et al. | 257/659 |
| 6,660,564 B2 | 12/2003 | Brady | |
| 6,762,072 B2 | 7/2004 | Lutz | |
| 6,841,861 B2 | 1/2005 | Brady | |
| 6,952,965 B2 | 10/2005 | Kang et al. | |
| 7,195,945 B1 | 3/2007 | Edelstein et al. | |
| 7,204,737 B2 * | 4/2007 | Ding et al. | 445/24 |
| 7,396,698 B2 | 7/2008 | Horning et al. | |
| 7,595,209 B1 | 9/2009 | Monadgemi et al. | |
| 7,622,324 B2 | 11/2009 | Enquist et al. | |
| 7,659,150 B1 | 2/2010 | Monadgemi et al. | |
| 7,736,929 B1 | 6/2010 | Monadgemi et al. | |
| 7,863,063 B2 | 1/2011 | Tan | |
| 7,923,790 B1 | 4/2011 | Quevy et al. | |
| 2006/0214246 A1 | 9/2006 | Garcia | |
| 2006/0214247 A1 | 9/2006 | DCamp et al. | |
| 2006/0258039 A1 | 11/2006 | Lutz et al. | |
| 2007/0220972 A1 * | 9/2007 | Araki et al. | 73/504.12 |
| 2009/0139331 A1 | 6/2009 | Axelrod et al. | |
| 2010/0117166 A1 * | 5/2010 | Geiger et al. | 257/415 |
| 2010/0267182 A1 | 10/2010 | Dungan et al. | |
| 2011/0018075 A1 * | 1/2011 | Chen et al. | 257/415 |
| 2011/0031565 A1 | 2/2011 | Marx et al. | |
| 2012/0142144 A1 * | 6/2012 | Taheri | 438/107 |
| 2014/0299949 A1 * | 10/2014 | Conti et al. | 257/416 |

OTHER PUBLICATIONS

Monajemi et al, "Chapter 9—MEMS Packaging" from "Introduction to System on Package: Miniaturization of the Entire System" by Rao Tummala, McGraw Hill, 1st edition, 2008, pp. 503-540.

* cited by examiner

Primary Examiner — Dale E Page
Assistant Examiner — Paul Budd

(57) ABSTRACT

Systems and methods for forming MEMS assemblies incorporating getters are described. One such method for forming and bonding to a microelectromechanical systems (MEMS) assembly includes providing a first MEMS wafer including a metal layer on an inner surface and one or more cavities for forming a MEMS component, attaching a MEMS capping wafer, having at least one through hole via, to the inner surface of the first MEMS wafer thereby forming at least one encapsulated MEMs component within the first MEMS wafer, and bonding a wire to the metal layer through an open end of the at least one through hole via.

9 Claims, 7 Drawing Sheets

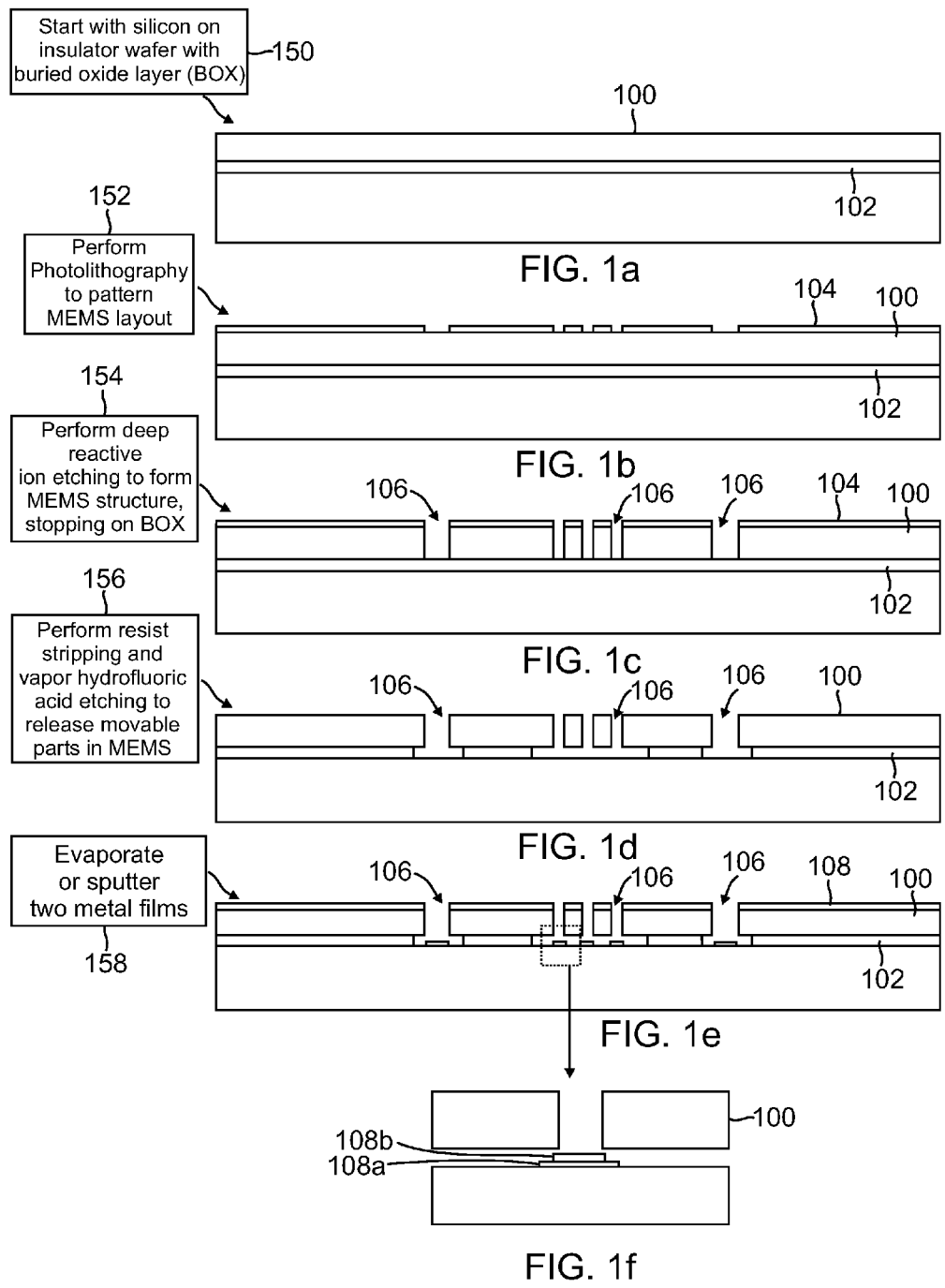

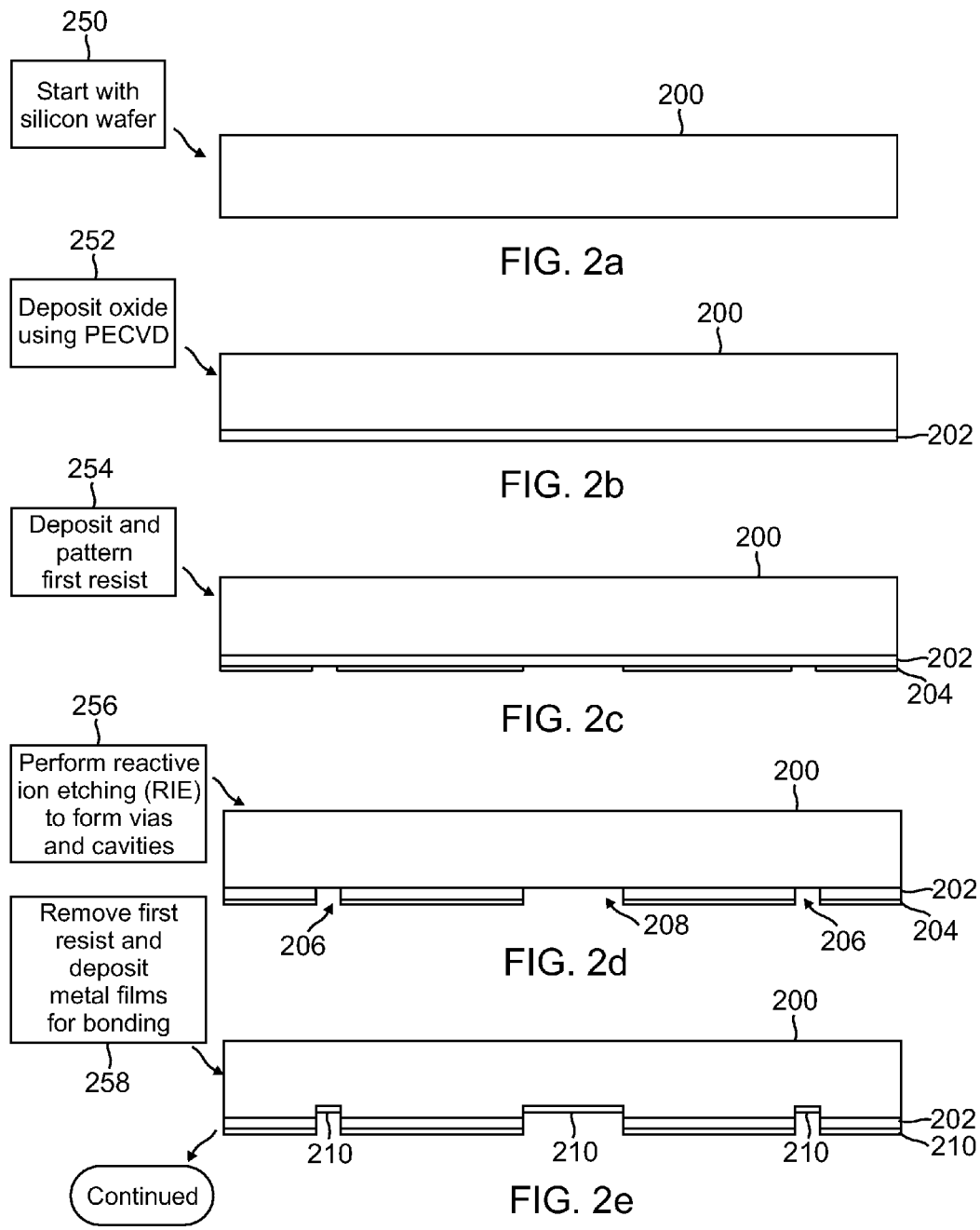

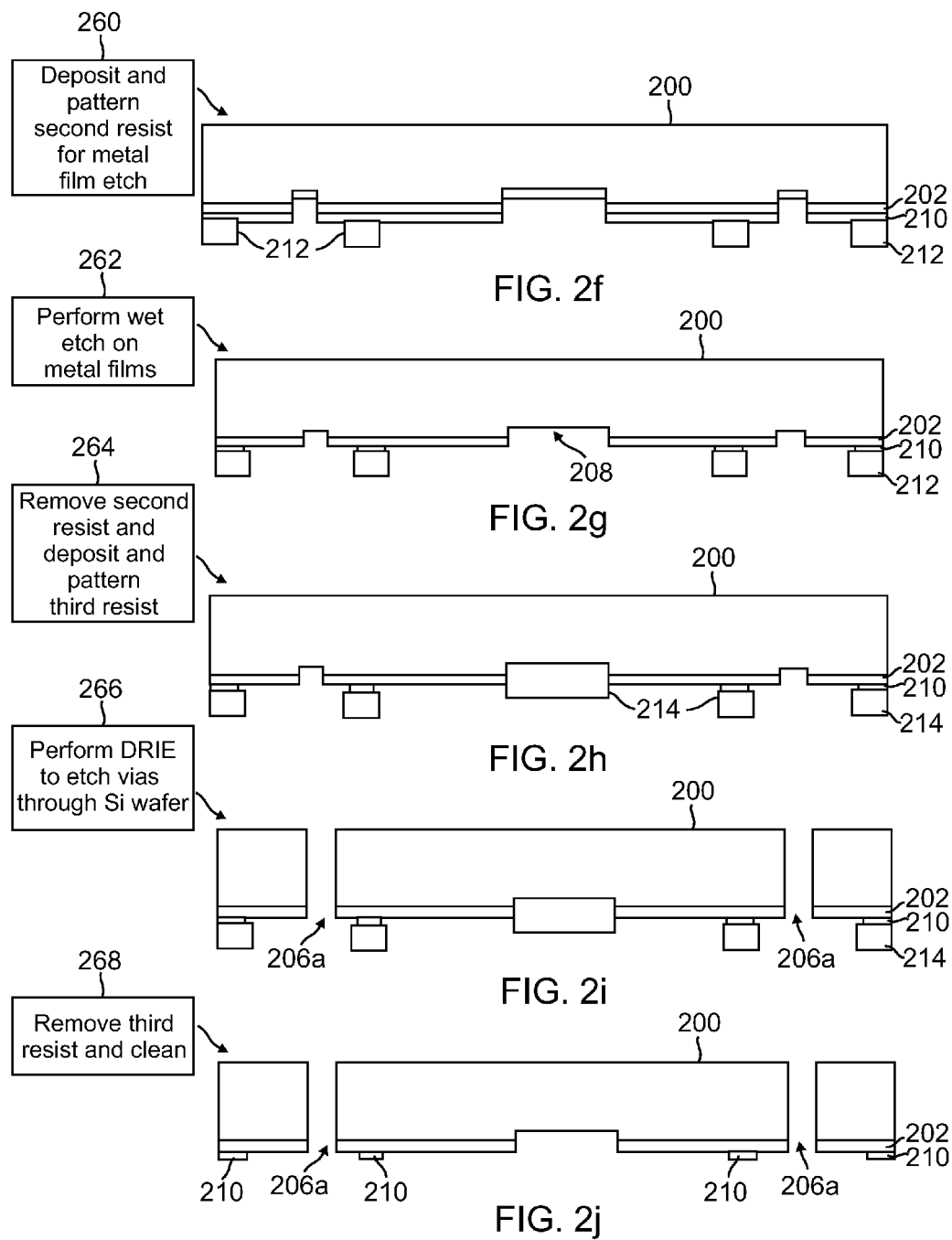

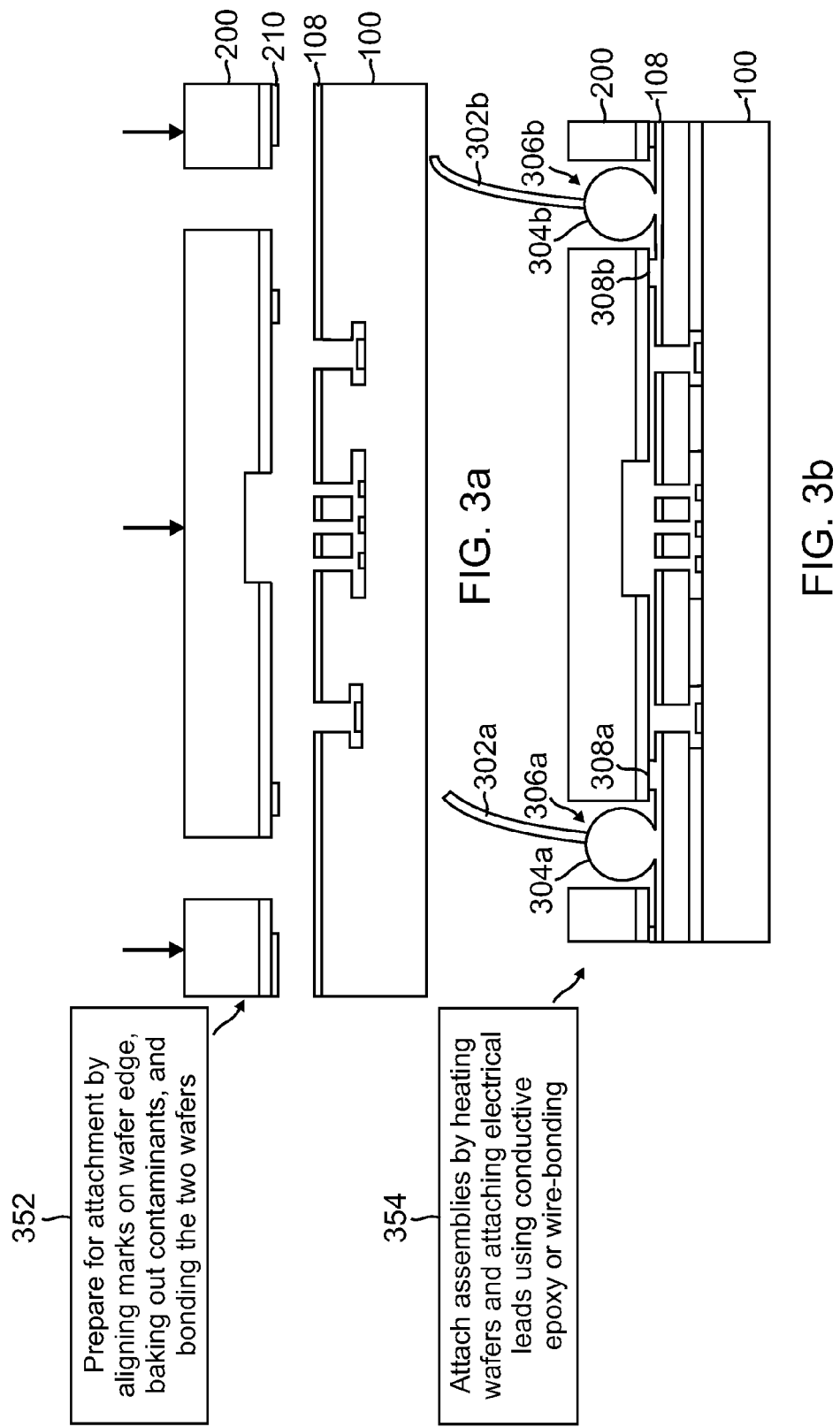

SYSTEMS AND METHODS FOR FORMING MEMS ASSEMBLIES INCORPORATING GETTERS

FIELD

The present invention relates to microelectromechanical systems (MEMS), and more specifically to systems and methods for forming MEMS assemblies incorporating getters.

BACKGROUND

Most MEMS devices are fabricated using techniques that leave the mechanical structures exposed after the fabrication process is completed. Open-die MEMS devices can be easily destroyed if their unprotected mechanical elements come in contact with a physical object, so physical protection can be important. MEMS are also very susceptible to degradation by small particles, water vapor, static friction and corrosion. As such, MEMS devices generally need microscopic protection and encapsulation.

The MEMS package creates an air or vacuum cavity over the MEMS active area without impeding its motion or function (e.g., deflection, tilt, slide, rotation, or vibration). Wafer-level packaging of MEMS represents a challenging and often costly task in micro-system manufacturing. MEMS packaging differs from traditional microelectronics packaging in that the encapsulating cover should generally not touch the micro-machined device. The packaging should protect the sensor while providing suitable electrical access to outside environment. Conventional MEMS packaging and fabrication techniques are often inadequate to meet the above described challenges. As such, a need exists for improved methods for fabricating and interfacing with MEMS devices.

SUMMARY

Aspects of the invention relate to systems and methods for forming MEMS assemblies incorporating getters. In one embodiment, the invention relates to a method for manufacturing a wafer of a microelectromechanical systems (MEMS) assembly, the method including providing the wafer including a buried oxide layer, depositing and patterning a first photo resist layer on the wafer, performing reactive ion etching on a surface of the wafer, the ion etching extending to the buried oxide layer, removing the first photo resist layer, removing portions of the buried oxide layer, thereby forming one or more cavities within the wafer, depositing a first metal layer configured to act as a getter within the one or more cavities, and depositing a second metal layer on the first metal layer.

In another embodiment, the invention relates to a method for manufacturing a cap for a microelectromechanical systems (MEMS) assembly, the method including providing a cap wafer, depositing a layer of oxide on the cap wafer, depositing and patterning a first photo resist layer on the oxide layer, removing portions of the oxide layer in accordance with the patterned first photo resist layer, removing the first photo resist layer, depositing one or more first metal layers on the cap wafer, depositing and patterning a second photo resist layer on the one or more first metal layers, removing portions of the one or more first metal layers in accordance with the patterned second photo resist layer, removing the second photo resist layer, depositing and patterning a third photo resist layer on the cap wafer, removing portions of the cap wafer in accordance with the oxide layer and the third photo resist layer to form one or more through hole vias, and removing the third photo resist layer.

In yet another embodiment, the invention relates to a method for forming and bonding to a microelectromechanical systems (MEMS) assembly, the method including providing a first MEMS wafer including a metal layer on an inner surface and one or more cavities for forming a MEMS component, attaching a MEMS capping wafer, having at least one through hole via, to the inner surface of the first MEMS wafer thereby forming at least one encapsulated MEMs component within the first MEMS wafer, and bonding a wire to the metal layer through an open end of the at least one through hole via.

In another embodiment, the invention relates to a microelectromechanical systems (MEMS) assembly including a first MEMS wafer including a metal layer on an inner surface and one or more cavities for forming a MEMS component, a MEMS capping wafer attached to the first surface of the first MEMS wafer, the MEMS capping wafer having at least one through hole via, thereby forming at least one encapsulated MEMs component within the first MEMS wafer, and a wire bonded to the metal layer through an open end of the at least one through hole via.

BRIEF DESCRIPTION OF THE DRAWINGS

FIGS. 1a to 1f show a sequence of side views of a base wafer and corresponding processing actions illustrating a process for forming a MEMS assembly wafer in accordance with one embodiment of the invention.

FIGS. 2a to 2j show a sequence of side views of a cap wafer and corresponding processing actions illustrating a process for forming a MEMS assembly cap wafer in accordance with one embodiment of the invention.

FIGS. 3a to 3b show a sequence of side views of a base wafer and a cap wafer and corresponding processing actions illustrating a process for attaching a MEMS assembly in accordance with one embodiment of the invention.

DETAILED DESCRIPTION

Figure 4:
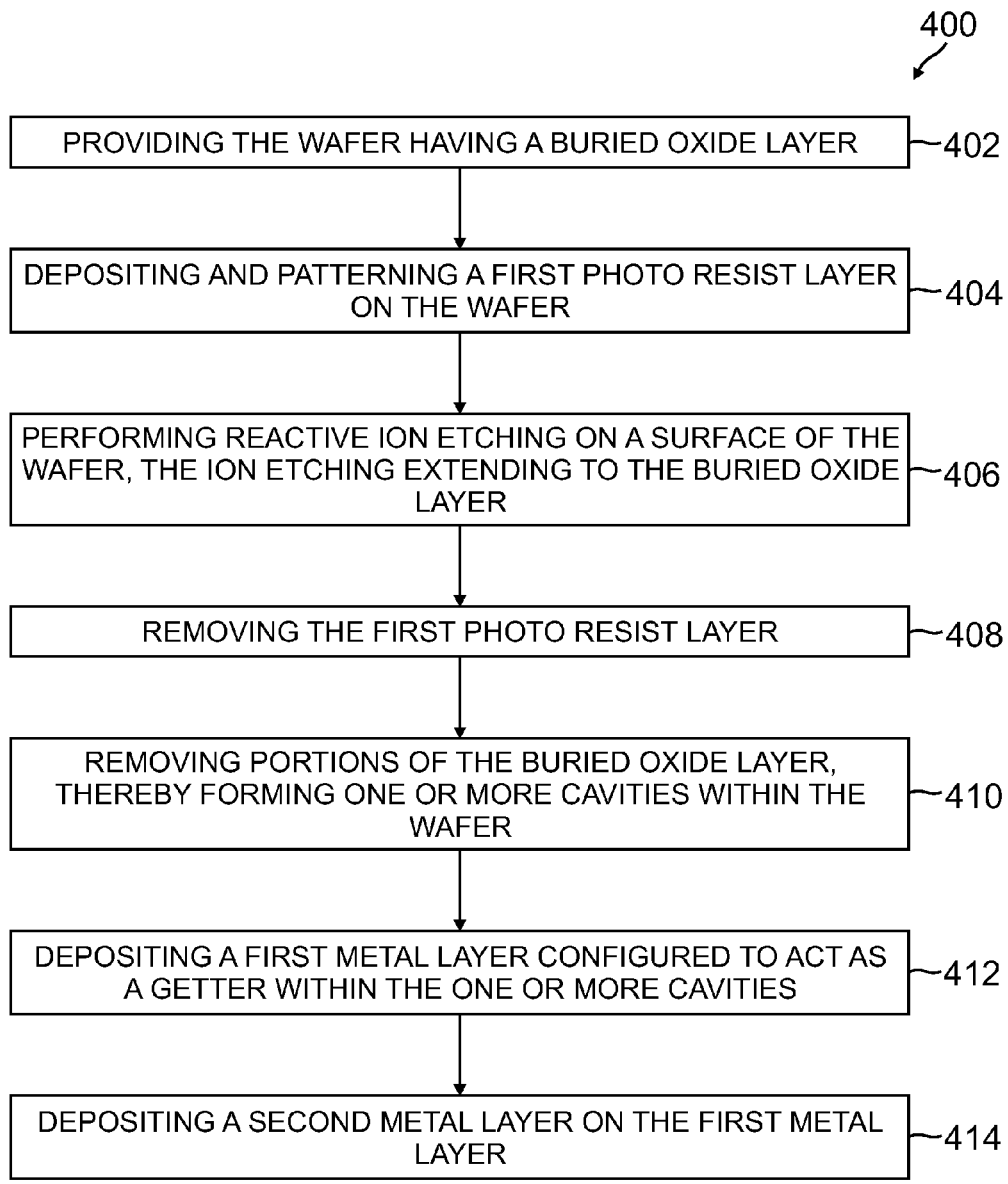
FIG. 4 is a flowchart of a process for forming a base wafer of a MEMS assembly in accordance with one embodiment of the invention.

Referring now to the drawings, embodiments of systems and methods for forming MEMS assemblies incorporating getters and enabling cavity wire bonding are illustrated. The methods include a process for forming a base wafer for a MEMs assembly, where the process includes forming a two layer conductive pad within a cavity of the base wafer. One of the two layers is configured to act as a getter to absorb water vapor and polymer outgassing within the cavity. The methods also include a process for forming a cap wafer of the MEMS assembly including use of multiple resist layers to form useful MEMs features for wire bonding such as through vias and cavities for coupling MEMS components.

In several embodiments, a MEMS assembly can be formed by attaching the base wafer and the cap wafer using a soldering process or another suitable attachment process. Once the MEMS assembly is formed, wire bonding within one of the through vias can be used to couple external electrical leads to internal/isolated electrodes within the MEMS assembly. The systems and methods for forming the MEMS assemblies are efficient, and therefore can provide reliable and high yield fabrication for a variety of MEMS sensors and actuators. In one embodiment, these sensors and actuators can include angular acceleration sensors to measure the rotational acceleration of a magnetic media of a storage drive.

FIGS. 1a to 1f show a sequence of side views of a base wafer 100 and corresponding processing actions illustrating a process for forming a MEMS assembly base wafer in accordance with one embodiment of the invention. As illustrated in FIG. 1a, the process starts (150) with a silicon on insulator wafer 100 including a buried oxide layer (BOX) 102. In one embodiment, the buried oxide layer 102 has a thickness of about 1 to 2 microns. As illustrated in FIG. 1b, the process then deposits and patterns (152) a layer of photo resist 104 to form a preselected MEMS layout. In FIG. 1c, the process then performs deep reactive ion etching (154) to form a preselected MEMS structure. The ion etching extends to, and stops on, the buried oxide layer (BOX) 102, thereby forming several cavities 106 for MEMS components. In one embodiment, the process can perform ion milling instead of, or in conjunction with, the reactive ion etching.

In FIG. 1d, the process performs resist stripping and hydrofluoric acid etching (156) to further expand the cavities 106 and thereby release movable MEMS parts. In some embodiments, other suitable acids can be used. In several embodiments, the acid etching uses either an aqueous acid or a vapor acid. In FIG. 1e, the process evaporates or sputters (158) two metal films 108, thereby forming conductive pads in the cavities 106 that can act as proof masses in an assembled MEMS device later. The first or bottom metal film deposited 108a is an adhesion metal such as Cr, Ti, or another suitable adhesion metal. The second or top metal film deposited 108b is a conductive contact metal for making electrical contact and for acting as a bonding surface. The second or top metal film deposited 108b can be a conductive metal such as Au, Al, In or another suitable conductive metal.

FIG. 1f illustrates an expanded view of one of the cavities 106 and the deposited metal films (108a, 108b). In several embodiments, portions of the bottom metal film 108a not covered by the top metal film 108b in the cavities 106 can act as a getter to absorb water vapor and polymer outgassing. In one embodiment, the bottom metal film 108a is deposited to have a thickness of about 200 to 500 nanometers. In another embodiment, the bottom metal film 108a is deposited to have a thickness of about 300 to 400 nanometers. In one embodiment, the bottom metal film 108a is deposited to have a thickness of about 1/10 to 1 times the thickness of the buried oxide layer. In several embodiments, the process of FIGS. 1a-1f provides a single mask process for fabricating a MEMS device.

In one embodiment, the process can perform the sequence of actions in a different order. In another embodiment, the process can skip one or more of the actions. In other embodiments, one or more of the actions are performed simultaneously. In some embodiments, additional actions can be performed.

FIGS. 2a to 2j show a sequence of side views of a cap wafer 200 and corresponding processing actions illustrating a process for forming a MEMS assembly cap wafer in accordance with one embodiment of the invention. As illustrated in FIG. 2a, the process starts (250) with a silicon wafer 200. In one embodiment, the top surface of the wafer 200 is ground to be relatively smooth while the bottom surface of the wafer 200 is polished. In one embodiment, the silicon wafer has a thickness of about 400 to 600 microns. As illustrated in FIG. 2b, the process then deposits (252) an oxide layer 202 using plasma enhanced chemical vapor deposition (PECVD). In other embodiments, other suitable deposition methods can be used instead of PECVD. In one embodiment, the oxide layer 202 is deposited with a thickness of about 3 microns.

As illustrated in FIG. 2c, the process then deposits and patterns (254) a first resist layer 204 on the oxide layer 202. In one embodiment, the first resist layer 204 is deposited with a thickness of about 1.8 microns. In other embodiments, the first resist layer 204 is deposited with another suitable thickness. As illustrated in FIG. 2d, the process then performs reactive ion etching (256) or RIE to form vias 206 and cavity 208 in the oxide layer 202. In some embodiments, the process first performs the RIE to remove portions of the oxide layer 202 and then performs deep reactive ion etching (DRIE) to remove portions of the silicon wafer 200 (e.g., remove about 10 microns of the silicon wafer 200). In one embodiment, the process can perform ion milling instead of, or in conjunction with, the reactive ion etching. In FIG. 2e, the process then removes (258) the first resist 204 and deposits metal films 210 for bonding. In one embodiment, the metal films 210 include an adhesion layer made of Cr or Ti, and a top metal layer made of Au, Sn, and/or Cu for soldering/bonding in subsequent assembly steps. In other embodiments, the metal films 210 can include other suitable metals. In one embodiment, the process of depositing the metal films 210 involves use of a full film deposition process that carefully avoids depositing metal on the sidewalls of the vias 206 and cavity 208.

As illustrated in FIG. 2f, the process then deposits and patterns (260) a second resist layer 212 for subsequent metal film etching. As illustrated in FIG. 2g, the process performs wet etching (262) on the metal film 210, thereby removing the metal film 210 from areas not protected by the second resist 212. In one embodiment, the process can perform ion milling instead of, or in conjunction with, the wet etching. As illustrated in FIG. 2h, the process removes (264) the second resist 212 and deposits and patterns a third resist layer 214 in order to protect the cavity area 208. As illustrated in FIG. 2i, the process then performs deep reactive ion etching (266) or DRIE to etch vias 206a through the silicon wafer 200. In one embodiment, the process can perform ion milling instead of, or in conjunction with, the reactive ion etching. As illustrated in FIG. 2j, the process then removes (268) the third resist 214 and cleans the assembly. The final cap assembly includes several remaining portions of the metal film layer 210 that can effectively act as conductive pads or electrodes in a final MEMs assembly.

In several embodiments, the various resist layers are patterned using photolithography or other suitable resist patterning techniques. In some embodiments, aluminum is used in the MEMS base wafer 100. In such case, glue type epoxies such as Norland 21 or photo resists such as SU8 can be used to adhesively bond the cap wafer 200 to the MEMS base wafer 100, in which case steps 262 and 264 can be eliminated from the process of FIGS. 2a-2j. Using aluminum or indium for the base wafer 100 enables low-temperature adhesive or eutectic bonding, however the coefficient of thermal expansion (CTE) can be very large (29 ppm/degree Celsius and 23 ppm/degree Celsius, respectively) and not matched to the silicon substrate (200). In such case, Au and Cr metal layers can provide better match to silicon (14.2 ppm/degree Celsius and 4.9 ppm/degree Celsius, respectively). In one embodiment, Ti is used as a seed layer in block 258. In such case, and if only Au is etched in block 262, then the remaining Ti inside the cap can serve as a getter, without compromising electrical isolation, since it will not get in contact with MEMS during subsequent wafer bonding.

In one embodiment, the process can form a getter in cavity 208 with the metal films 210 deposited in step 258. In such case, the process can deposit the second resist 212 in the cavity 208 in step 260 to protect the metal films 210 and skip step 264.

In one embodiment, the process can perform the sequence of actions in a different order. In another embodiment, the process can skip one or more of the actions. In other embodiments, one or more of the actions are performed simultaneously. In some embodiments, additional actions can be performed.

FIGS. 3a to 3b show a sequence of side views of a base wafer 100 and a cap wafer 200 and corresponding processing actions illustrating a process for attaching a MEMS assembly in accordance with one embodiment of the invention. As illustrated in FIG. 3a, the process prepares for attachment (352) of the base wafer 100 and cap wafer 200 by aligning the wafers, baking out contaminants, and bonding the two wafers using either direct bonding or soldering. In several embodiments, solder on the conductive pads 210 of the cap wafer 200 is brought into contact with the metal layers 108 of the base wafer 100 and the assembly heated. As a result, the base wafer 100 and cap wafer 200 become attached at each of the conductive pads 210. In some embodiments, the wafers are attached using direct bonding such as gold to gold or copper to copper type bonding. In other embodiments, the wafers are attached using gold to tin or gold to indium soldering.

As illustrated in FIG. 3b, the process then attaches (354) the assemblies by heating the wafers (as described above) and attaches electrical leads (302a, 302b) using conductive epoxy and/or wire bonding. In the embodiment illustrated in FIG. 3b, a terminal end of the electrical lead 302a is formed into a conductive metal ball 304a and secured to conductive metal layer 108 within cavity 306 by wire bonding techniques. In other embodiments, the electrical lead 302a can be secured to the conductive metal layer 108 using conductive epoxy or other suitable means of attachment known in the art. In one embodiment, the electrical lead 302a is made of gold. As conductive metal layers 108 are coupled to electrical leads 302a and 302b, isolated electrodes 308a and 308b are coupled electrical leads 302a and 302b, respectively.

In several embodiments, during attachment, the base wafer 100 and cap wafer 200 are aligned and brought in contact by applying a force at a eutectic temperature. Examples of suitable eutectic temperatures for various material combinations include: 363 degrees Celsius for Au—Si, 283 degrees Celsius for Au—Sn, and 118 degrees Celsius for In—Sn. In several embodiments, both the base wafer 100 and cap wafer 200 have been processed for fine flatness and surface finish.

FIG. 4 is a flowchart of a process 400 for forming a wafer of a MEMS assembly in accordance with one embodiment of the invention. In particular embodiments, the process 400 can be used to form the wafer assembly of FIGS. 1a-1f. The process first provides (402) a wafer including a buried oxide layer (BOX). The process then deposits (404) and patterns a first photo resist layer on the wafer. The process then performs reactive ion etching (406) on a surface of the wafer, the reactive ion etching extending to the buried oxide layer. The process then removes (408) the first photo resist layer. The process removes (410) portions of the buried oxide layer, thereby forming one or more cavities within the wafer. The process then deposits (412) a first metal layer configured to act as a getter within the one or more cavities. The process then deposits (414) a second metal layer on the first metal layer.

In one embodiment, the process can perform the sequence of actions in a different order. In another embodiment, the process can skip one or more of the actions. In other embodiments, one or more of the actions are performed simultaneously. In some embodiments, additional actions can be performed.

Figure 5:
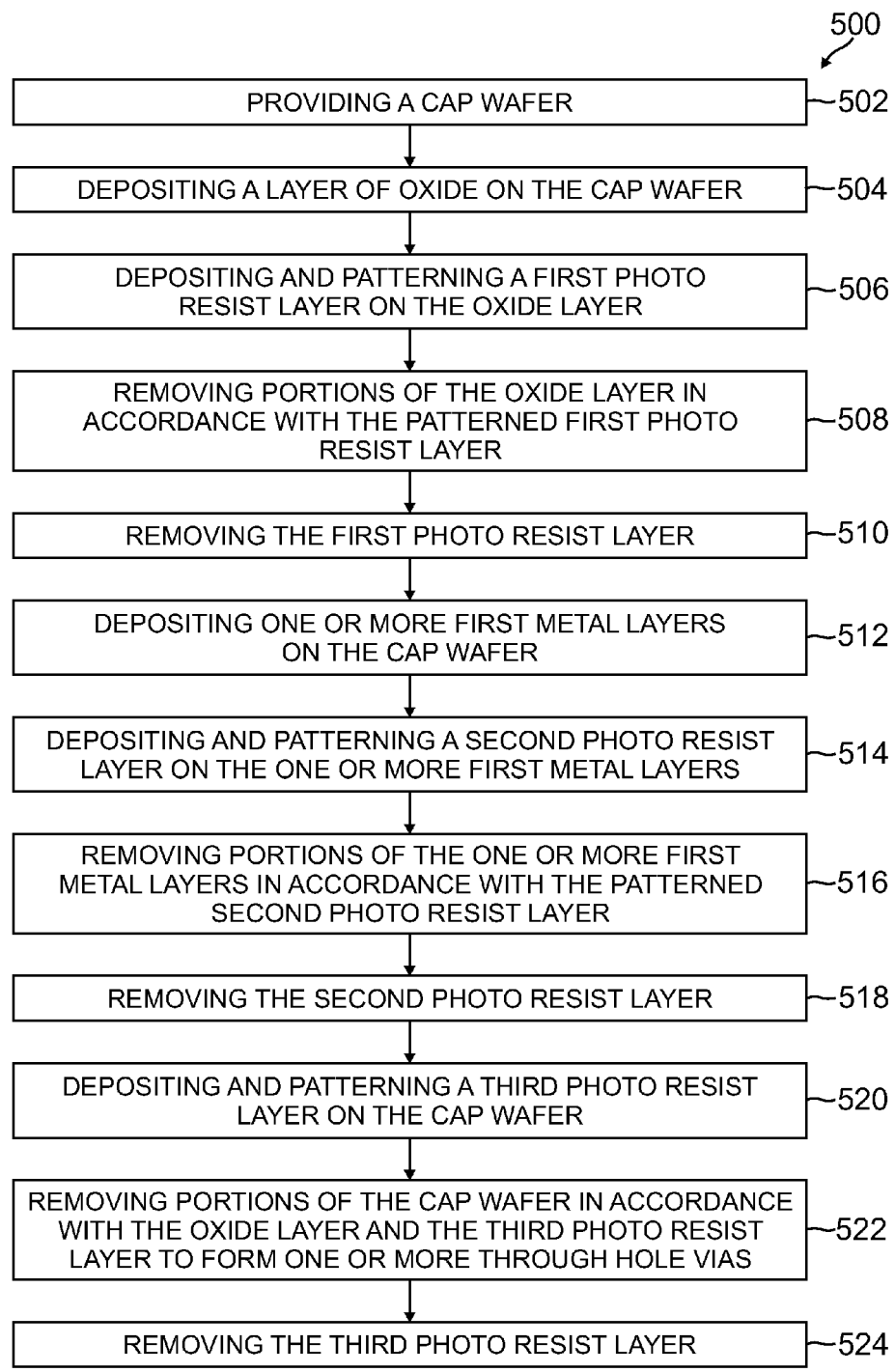
FIG. 5 is a flowchart of a process for forming a cap wafer of a MEMS assembly in accordance with one embodiment of the invention.

FIG. 5 is a flowchart of a process 500 for forming a cap wafer of a MEMS assembly in accordance with one embodiment of the invention. In particular embodiments, the process 500 can be used to form the wafer assembly of FIGS. 2a-2j. The process first provides (502) a cap wafer. The process then deposits (504) a layer of oxide on the cap wafer. The process deposits and patterns (506) a first photo resist layer on the oxide layer. The process then removes (508) portions of the oxide layer in accordance with the patterned first photo resist layer. The process removes (510) the first photo resist layer. The process then deposits (512) one or more first metal layers on the cap wafer.

The process deposits and patterns (514) a second photo resist layer on the one or more first metal layers. The process then removes (516) portions of the one or more first metal layers in accordance with the patterned second photo resist layer. The process removes (518) the second photo resist layer. The process then deposits and patterns (520) a third photo resist layer on the cap wafer (e.g., to protect a cavity area). The process removes (522) portions of the cap wafer in accordance with the oxide layer and the third photo resist layer to form one or more through hole vias. The process then removes (524) the third photo resist layer to form a completed cap wafer assembly.

In one embodiment, the process can perform the sequence of actions in a different order. In another embodiment, the process can skip one or more of the actions. In other embodiments, one or more of the actions are performed simultaneously. In some embodiments, additional actions can be performed.

Figure 6:
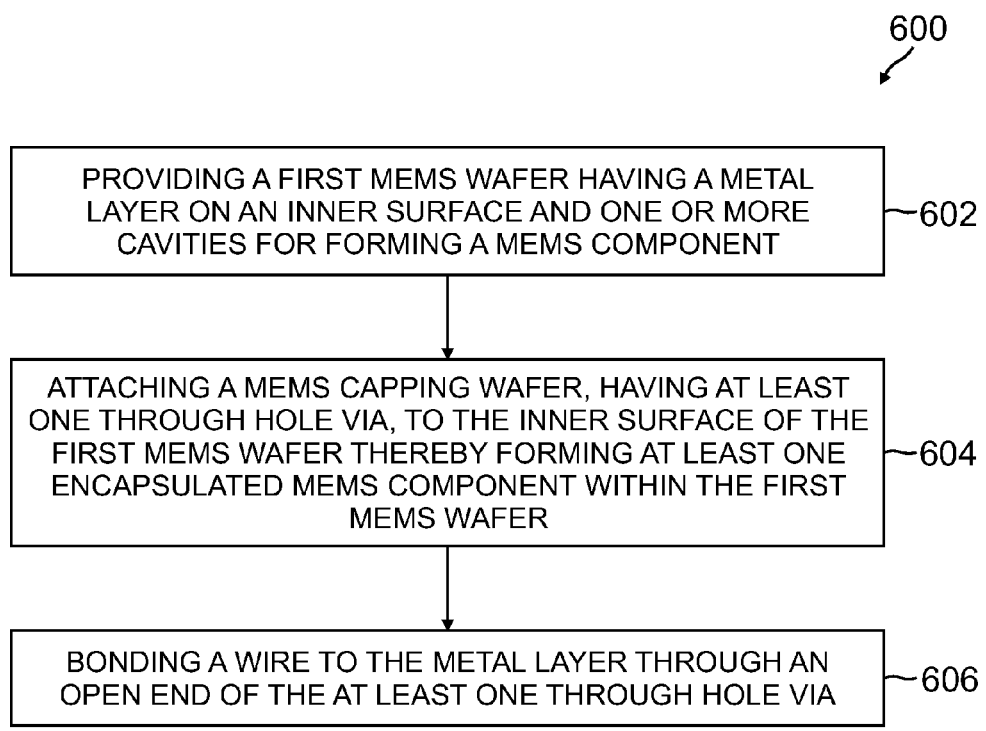
FIG. 6 is a flowchart of a process for attaching a base wafer and a cap wafer of a MEMS assembly in accordance with one embodiment of the invention.

FIG. 6 is a flowchart of a process 600 for attaching a wafer and a cap wafer of a MEMS assembly in accordance with one embodiment of the invention. In particular embodiments, the process 600 can be used to form the MEMs assembly of FIGS. 3a-3b. The process first provides (602) a first MEMS wafer having a metal layer on an inner surface and one or more cavities for forming a MEMS component. The process then attaches (604) a MEMS capping wafer, having at least one through hole via, to the inner surface of the first MEMS wafer thereby forming at least one encapsulated MEMs component within the first MEMS wafer. The process then bonds (606) a wire to the metal layer through an open end of the at least one through hole via.

In one embodiment, the process can perform the sequence of actions in a different order. In another embodiment, the process can skip one or more of the actions. In other embodiments, one or more of the actions are performed simultaneously. In some embodiments, additional actions can be performed.

In several embodiments, the proposed single-mask MEMS flow of FIGS. 1a-1f provides a clean and simple MEMS structure and helps to avoid drawbacks on MEMS performance caused by process variability, while the more complex cap wafer process of FIGS. 2a-2j bears the burden of completing the three dimensional structures for the final packaged MEMS device. As such, these overall processes can provide advantages including: (1) the MEMS wafer process and modular capping process are relatively simple, (2) the wafer capping can be performed via two-layer adhesive bonding (non-hermetic) or three-layer eutectic bonding (hermetic), (3) the small bond area design reduces CTE mismatch issues, (4) both the MEMS wafer and cap wafer can contain getter layers, such as Ti used as seed layer for metal interface, and (5) the cap can be used as independent electrode in some applications.

While the above description contains many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents.

What is claimed is:

1. A microelectromechanical systems (MEMS) assembly comprising:
   a first MEMS wafer comprising a metal layer on an inner surface and one or more cavities for forming a MEMS component;
   a MEMS capping wafer attached to the metal layer of the first MEMS wafer, the MEMS capping wafer having at least one through hole via, thereby forming at least one encapsulated MEMs component within the first MEMS wafer; and
   a wire bonded to the metal layer through an open end of the at least one through hole via,
   wherein a first cavity of the one or more cavities comprises a first conductive pad,
   wherein a second cavity of the one or more cavities comprises a second conductive pad, and
   wherein each of the first and second conductive pads comprises a getter material.

2. The assembly of claim 1:
   wherein the MEMS capping wafer comprises an inner surface and an outer surface, and one or more electrodes positioned along the inner surface of the MEMS capping wafer, and
   wherein the one or more electrodes are attached to the metal layer of the first MEMS wafer.

3. The assembly of claim 2, wherein a first electrode of the one or more electrodes is positioned between a first through hole via of the at least one through hole via and a first cavity of the one or more cavities.

4. The assembly of claim 1, wherein the getter material comprises a metal selected from the group consisting of Ti and Cr.

5. The assembly of claim 1, wherein the MEMS assembly forms one or more accelerometers.

6. The assembly of claim 1, wherein the wire comprises a ball formed of a portion of the wire, wherein the ball is bonded to the metal layer through the open end of the at least one through hole via.

7. The assembly of claim 1:
   wherein the MEMS capping wafer comprises an inner surface and an outer surface, and one or more electrodes positioned along the inner surface of the MEMS capping wafer, and
   wherein the inner surface of the MEMS capping wafer comprises oxide.

8. A microelectromechanical systems (MEMS) assembly comprising:
   a first MEMS wafer comprising a metal layer on an inner surface and one or more cavities for forming a MEMS component;
   a MEMS capping wafer attached to the metal layer of the first MEMS wafer, the MEMS capping wafer having at least one through hole via, thereby forming at least one encapsulated MEMs component within the first MEMS wafer; and
   a wire bonded to the metal layer through an open end of the at least one through hole via,
   wherein the MEMS capping wafer comprises an inner surface and an outer surface, and one or more electrodes positioned along the inner surface of the MEMS capping wafer,
   wherein the one or more electrodes are attached to the metal layer of the first MEMS wafer,
   wherein a first electrode of the one or more electrodes is positioned between a first through hole via of the at least one through hole via and a first cavity of the one or more cavities, and
   wherein a second electrode of the one or more electrodes is positioned between a second through hole via of the at least one through hole via and a second cavity of the one or more cavities.

9. The assembly of claim 8, wherein the first electrode and the second electrode are electrically isolated.

* * * * *